United States Patent
Yun et al.

(10) Patent No.: US 12,477,895 B2
(45) Date of Patent: Nov. 18, 2025

(54) DISPLAY DEVICE AND MANUFACTURING METHOD THEREOF

(71) Applicant: Samsung Display Co., LTD., Yongin-si (KR)

(72) Inventors: Hyun Kyung Yun, Namyangju-si (KR); Cheul Jin Park, Seoul (KR); Kisang Yoo, Asan-si (KR); Joon-Ik Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 491 days.

(21) Appl. No.: 17/970,586

(22) Filed: Oct. 21, 2022

(65) Prior Publication Data

US 2023/0126098 A1   Apr. 27, 2023

(30) Foreign Application Priority Data

Oct. 22, 2021 (KR) .......................... 10-2021-0141619

(51) Int. Cl.
*H10K 50/84* (2023.01)
*H10K 71/00* (2023.01)
*H10K 77/10* (2023.01)
*H10K 102/00* (2023.01)

(52) U.S. Cl.
CPC ........... *H10K 50/841* (2023.02); *H10K 71/00* (2023.02); *H10K 77/111* (2023.02); *H10K 2102/311* (2023.02)

(58) Field of Classification Search
CPC .... H10K 50/841; H10K 71/00; H10K 77/111; H10K 2102/311; H10K 59/873; H10K 30/87; H10K 50/844; H10K 50/85
See application file for complete search history.

(56) References Cited

U.S. PATENT DOCUMENTS

| | | | |
|---|---|---|---|
| 11,169,647 B2 | 11/2021 | Kim | |
| 11,221,645 B2 | 1/2022 | Won | |
| 2015/0324056 A1 | 11/2015 | Sato | |
| 2017/0202094 A1 | 7/2017 | Kim | |
| 2019/0302939 A1 | 10/2019 | Hong et al. | |
| 2020/0057545 A1* | 2/2020 | Seomoon | H10K 59/40 |
| 2020/0178384 A1* | 6/2020 | Han | H04M 1/0266 |
| 2020/0328382 A1* | 10/2020 | Lee | H10K 59/879 |
| 2021/0034121 A1 | 2/2021 | Lee et al. | |
| 2022/0077271 A1 | 3/2022 | Lee et al. | |
| 2022/0143931 A1 | 5/2022 | Shim et al. | |
| 2022/0255044 A1 | 8/2022 | Kim et al. | |

FOREIGN PATENT DOCUMENTS

| | | |
|---|---|---|
| JP | 2015215800 A | 12/2015 |
| KR | 10-2015-0005075 | 1/2015 |
| KR | 20170083686 A | 7/2017 |

(Continued)

*Primary Examiner* — J.E. Schoenholtz
(74) *Attorney, Agent, or Firm* — CANTOR COLBURN LLP

(57) ABSTRACT

A display device including a display panel including a front portion and a corner portion disposed at a corner of the front portion, a patterned film disposed on a rear surface of the display panel, a cover panel disposed on the rear surface of the patterned film and overlapping the front portion, and a coating layer disposed on the rear surface of the patterned film and overlapping the corner portion.

19 Claims, 22 Drawing Sheets

(56) References Cited

FOREIGN PATENT DOCUMENTS

| | | |
|---|---|---|
| KR | 20190115132 A | 10/2019 |
| KR | 10-2020-0100223 | 8/2020 |
| KR | 20200120784 A | 10/2020 |
| KR | 10-2020-0145934 | 12/2020 |
| KR | 20200140450 A | 12/2020 |
| KR | 10-2021-0016231 | 2/2021 |
| KR | 10-2022-0033574 | 3/2022 |

* cited by examiner

DISPLAY DEVICE AND MANUFACTURING METHOD THEREOF

CROSS-REFERENCE TO RELATED APPLICATION

This application claims priority from and the benefit of Korean Patent Application No. 10-2021-0141619, filed on Oct. 22, 2021, which is hereby incorporated by reference for all purposes as if fully set forth herein.

BACKGROUND

Field

Embodiments of the invention relate generally to a display device, and more particularly, to a display device including a curved area and a manufacturing method thereof.

Discussion of the Background

A display device, such as an emissive display device and a liquid crystal display (LCD), is applied to an electronic device, such as a smartphone, a mobile phone, and a multimedia terminal. Since a display device, particularly a screen of the display device, is a part exposed to the outside of an electronic device, the display device is a key element in the design of an electronic device.

Except for display devices such as a cathode ray tube, a display device commonly used is formed in a flat panel, and the screen is also formed in a flat panel. Recently, as flexible display devices have been developed, the screen has not been limited to a flat surface, but may be formed with a curved surface. In particular, when the edge of the display device is formed with a curved surface, the screen ratio (screen-to-body ratio) of the display device can be increased. The screen ratio is considered as reflecting the technology level of the display device, and may be an important factor consumers consider when selecting a product.

A display device including a curved region, particularly a curved corner portion, may include a window having a three-dimensional shape. When the window has a three-dimensional shape, it may be difficult to reliably attach the cover panel to the display panel in a conventional way.

The above information disclosed in this Background section is only for understanding of the background of the inventive concepts, and, therefore, it may contain information that does not constitute prior art.

SUMMARY

Display devices constructed according to illustrative implementations of the invention are capable of improving reliability and visibility while having an increased screen-to-body ratio.

Embodiments also provide a method for attaching a cover panel to the rear surface of the display panel without wrinkles in a display device including a curved corner portion, and for securing light blocking, shielding and impact resistance in the curved corner portion.

Additional features of the inventive concepts will be set forth in the description which follows, and in part will be apparent from the description, or may be learned by practice of the inventive concepts.

A display device according to an embodiment includes: a display panel including a front portion and a corner portion disposed at a corner of the front portion; a patterned film disposed on a rear surface of the display panel; a cover panel disposed on a rear surface of the patterned film and overlapping the front portion; and a coating layer disposed on the rear surface of the patterned film and overlapping the corner portion.

The display device may further include an adhesive layer disposed between the cover panel and the rear surface of the patterned film, in which the coating layer may be directly disposed on the rear surface of the patterned film.

The coating layer may include a primer layer disposed on the patterned film, a foam coating layer disposed on the primer layer, and a hard coating layer disposed on the foam coating layer.

The patterned film may include a silicon-based polymer, and the primer layer may include a silicon primer layer.

The hard coating layer may include a conductive filler.

At least one of the primer layer, the foam coating layer, and the hard coating layer may include a black dye or pigment.

The coating layer may be thinner than the cover panel.

The cover panel may include at least one of a shield layer, a support layer, a cushion layer, and a light blocking layer.

The front portion may be flat, and the corner portion may have a double curved surface. The corner portion may include a plurality of stripe areas separated from each other, and he plurality of stripe areas may be combined to form the double curved surface of the corner portion.

The patterned film may include a plurality of portions corresponding to the plurality of stripe areas. A first gap between adjacent stripe areas may be greater than a second gap between adjacent portions of the patterned film.

A display device according to an embodiment includes: a display panel including a front portion, a side portion disposed at a side of the front portion, and a corner portion disposed at a corner of the front portion; a patterned film attached to the display panel; a cover panel attached to the patterned film and covering the front portion and the side portion; and a coating layer coated on the patterned film and covering the corner portion.

The display panel may include a substrate, a transistor disposed on the substrate, and a light emitting diode connected to the transistor. The patterned film may be attached to the substrate.

The corner portion may include a double curved surface. The coating layer may include a primer layer coated on a surface of the patterned film, a foam coating layer coated on a surface of the primer layer, and a hard coating layer coated on a surface of the foam coating layer.

The patterned film may include a silicon-based polymer, and the primer layer may include a silicon primer layer.

The hard coating layer may include a conductive filler.

At least one of the primer layer, the foam coating layer, and the hard coating layer may include a black dye or pigment.

The corner portion may include a plurality of stripe areas separated from each other. The patterned film may include a plurality of portions corresponding to the plurality of stripe areas. A gap between adjacent portions of the patterned film may be less than a gap between adjacent stripe areas.

A manufacturing method of a display device according to an embodiment includes: attaching a patterned film to a display panel that includes a front portion and a corner portion disposed at a corner of the front portion; attaching the display panel to which the patterned film is attached to a window; attaching a cover panel to the patterned film to overlap the front portion while not overlapping the corner portion; and forming a coating layer on a surface of the patterned film to overlap the corner portion.

The step of forming the coating layer may include: forming a primer layer on the surface of the patterned film; forming a foam coating layer on a surface of the primer layer; and forming a hard coating layer on a surface of the foam coating layer.

Pre-curing the primer layer before forming the foam coating layer, pre-curing the foam coating layer before forming the hard coating layer, and main-curing the primer layer and the foam coating layer after forming the hard coating layer may be carried out.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION OF THE EMBODIMENTS

Figure 1:
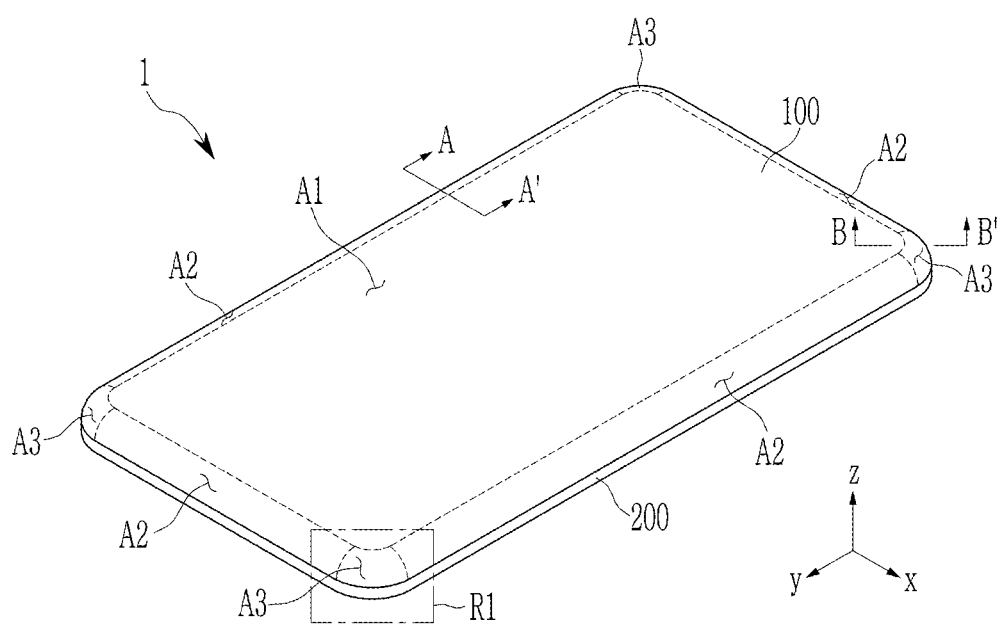
FIG. 1 is a schematic perspective view of an electronic device to which a display device according to an embodiment is applied.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
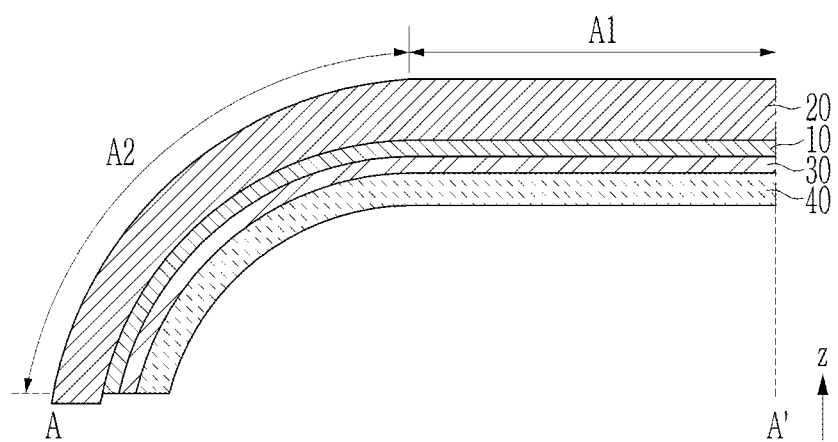
FIG. 2 is a schematic cross-sectional view taken along line A-A' of the display device in FIG. 1.
Figure 3:
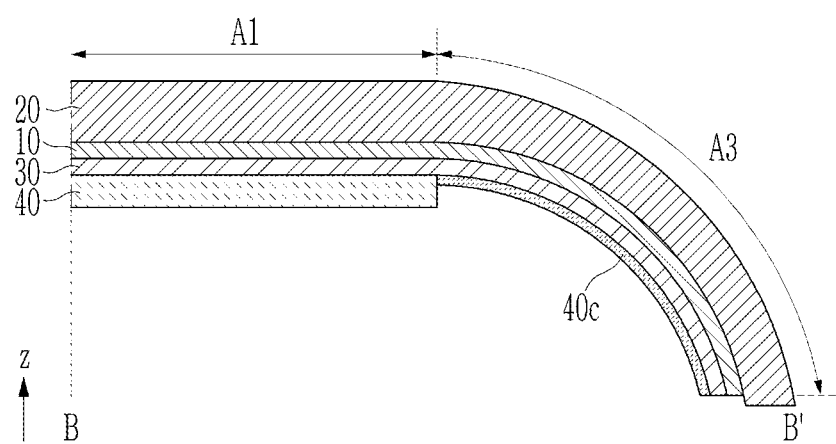
FIG. 3 is a schematic cross-sectional view taken along line B-B' of the display device in FIG. 1.
Figure 4:
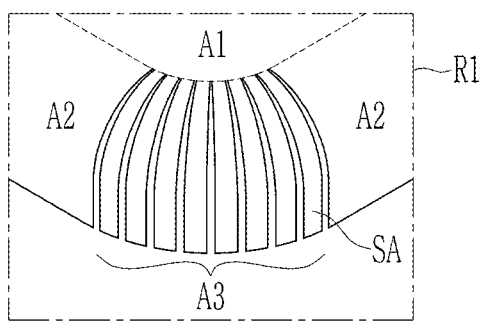
FIG. 4 is an enlarged view of region R1 in FIG. 1.

FIG. 1 is a schematic perspective view of an electronic device to which a display device according to an embodiment is applied, FIG. 2 is a schematic cross-sectional view taken along line A-A' of the display device in FIG. 1, FIG. 3 is a schematic cross-sectional view taken along line B-B' of the display device in FIG. 1, and FIG. 4 is an enlarged view of the region R1 in FIG. 1.

Referring to FIG. 1, a display device 100 according to an embodiment can be applied to electronic devices, such as smartphones, mobile phones, tablets, multimedia players, and game devices. The electronic device 1 may include a display device 100 and a housing 200. The display device 100 may provide a screen, on which an image is displayed, on the electronic device 1. The housing 200 may be referred to as a set frame, and the display device 100 may be fixed in the housing 200. In an inner space defined by the display device 100 and the housing 200, several components constituting the electronic device 1 can be positioned. For example, a processor, a memory, a battery, a driving apparatus, a camera, a speaker, a microphone, a receiver, a communication module, various sensors, and the like may be positioned inside the electronic device 1.

The entire front of the electronic device 1 may correspond to the screen, and at least a portion of the side may also correspond to the screen. The screen may correspond to a display area of the display device 100, that is, a region in which an image can be displayed. The display device 100 may include a front portion A1 (or first region) positioned on a front, side portions A2 (or second regions) positioned on the sides of the front portion A1, and corner portions A3 (or third regions) positioned on the corners of the front portion A1.

The front portion A1 may be positioned in a center of the display device 100 and may occupy most of the screen. The side portions A2 and the corner portions A3 may be positioned around the front portion A1. The front portion A1 may form a front display area. Most of the side portions A2 may form a side display area, and most of corner portions A3 may form a corner display area. The front portion A1 may be flat, and the side portions A2 and the corner portions A3 may be curved. An edge portion of the side portions A2 and an edge portion of the corner portions A3 may be a non-display area, that is, a region in which no image is displayed.

The front portion A1 may occupy the widest area in the entire display area, and may form a substantially flat screen. In a plan view, the front portion A1 may have substantially a rectangular shape having four sides as a whole. The corners of the front portion A1 may be round as shown, but may also be pointed. Four sides of the front portion A1 may be parallel to each other in the first direction (e.g., x-axis direction) or the second direction (e.g., y-axis direction).

The side portions A2 may be connected to each of the four sides of the front portion A1. Each side portion A2 may form a curved surface (e.g., a short curved surface), and the curvature may be constant or different depending on the position of the curved surface. Each side portion A2 may have a shape that is similar to a portion (e.g., ¼) of a side of a curved pillar, such as an elliptical pillar or a cylinder. As another example, in the side portion A2, a region close to the front portion A1 may be curved, and a region distant from the front portion A1 may be flat.

The corner portions A3 may be positioned at the four corners of the display device 100. Each corner portion A3 may be positioned between two adjacent side portions A2. Each corner portion A3 may form a curved surface (e.g., double curved surface). The curvature of a curved surface may be constant or different depending on the position. The shape of the curved surface of the corner portion A3 may be different from the curved shape of the side portion A2. For example, each corner portion A3 may have a shape similar to a portion (e.g., ⅛) of a curved body, such as a sphere or an elliptical sphere.

When the electronic device 1 is viewed from the top, the entire front portion A1, the side portions A2, and the corner portions A3 are combined to form a screen of a rectangular shape with rounded corners as a whole. The housing 200 may be invisible or almost invisible, and may implement a substantially bezel-less electronic device 1 with a screen-to-body ratio of 1 or almost 1.

Referring to FIG. 2 and FIG. 3, the display device 100 may include a display panel 10, a window 20, a patterned film 30, and a cover panel 40.

In the display device 100, an image may be displayed by the display panel 10. At least a part of the display panel 10 may be flexible. Pixels are arranged on a substrate in the display panel 10, and an image can be displayed by combinations of the pixels. The display panel 10 may include a front portion A1, side portions A2, and corner portions A3 respectively corresponding to the front portion A1, the side portions A2, and the corner portions A3 of the display device 100. For example, pixels including a red pixel, a green pixel, and a blue pixel may be arranged on the side portions A2, the corner portions A3, as well as the front portion A1 of the display panel 10. The pixels may be disposed to the entire front portion A1 of the display panel 10 and most of the side portions A2 and corner portions A3. Accordingly, the entire front portion A1 of the display panel 10 and most of the side portions A2 and corner portions A3 of the display panel 10 may be the display area. Edge portions of the side portions A2 of the display panel 10 and edge portions of the corner portions A3 may be non-display areas (i.e., an area where pixels are not disposed). Pixel circuit portions and signal lines may be disposed in the display panel 10 for driving the pixels. The display panel 10 may be a light emitting display panel including light emitting elements. The display panel 10 may include a touch sensor layer capable of sensing touch.

The window 20 may cover the display panel 10, and may transmit an image displayed on the display panel 10 therethrough. The window 20 may be formed as a cover that protects the display panel 10 from external impact. The window 20 may also function as a support to maintain the curved surface of the display panel 10. The window 20 may be formed of a transparent and hard material, such as glass or plastic, such that the user can see the image displayed on the screen of the display panel 10. The window 20 may include a front portion A1, side portions A2, and corner portions A3 respectively corresponding to the front portion A1, the side portions A2, and the corner portions A3 of the display device 100.

The patterned film 30 may be attached to a rear surface of the display panel 10 and may protect the display panel 10 from a manufacturing process of the display device 100. The patterned film 30 may be referred to as a protective film or a lower protective film. The patterned film 30 may be positioned to cover the front portion A1, the side portions A2, and the corner portions A3 of the display panel 10. The patterned film 30 may include a polymer, such as a silicon-based polymer (e.g., polydimethylsiloxane (PDMS)) and an elastomer (e.g., elastomeric polyurethane (EPU)).

The cover panel 40 may be attached to the back side of the patterned film 30, and the display panel 10 may be protected from the environment (e.g., impact, electromagnetic waves, heat, noise, and the like) on the back side of the display panel 10. The cover panel 40 may be referred to as a protecting sheet, a lower sheet, and the like. The cover panel 40 may include a front portion A1 and side portions A2 corresponding to the front portion A1 and side portions A2 of the display panel 10, respectively, but may not include portions corresponding to the corner portions A3 of the display panel 10. In particular, the cover panel 40 may be positioned in the front portion A1 and the side portions A2, but may not be positioned in the corner portion A3. As such, the cover panel 40 may include a portion overlapping the front portion A1 and the side portion A2 of the display panel 10 or covering the front portion A1 and the side portion A2 of the display panel 10, but may not include a portion overlapping the corner portion A3 of the display panel 10 or covering the corner portion A3 of the display panel 10. In the corner portion A3, instead of the cover panel 40, a coating layer 40c may be positioned on the back side of the patterned film 30. The coating layer 40c may perform substantially equivalent functions as those of the cover panel 40. A thickness of coating layer 40c may be thinner than that of the cover panel 40, without being limited thereto.

FIG. 4 shows one corner portion A3 of the display panel 10, and a front portion A1 and side portions A2 adjacent thereto according to an embodiment. In order to realize a double curved surface of the corner portion A3, the corner portion A3 may be cut into a plurality of regions. Accordingly, the corner portion A3 of the display panel 10 may include separated stripe areas SA. Each of the stripe areas SA may extend approximately radially from the edge of the front portion A1. In each stripe area SA, pixels may be arranged in one or more columns along the length direction of the stripe area SA. The stripe areas SA may be combined to form a double curved surface of the corner portion A3. The edges of the stripe area SA may define the edges of the corner portion A3. The stripe area SA may be stretchable.

The front portion A1 and the side portion A2 of the display panel 10 may include one physically continuous substrate and stacked layers thereon. The front portion A1 and the corner portion A3 may include one physically continuous substrate and layers stacked thereon. However, the substrate may be physically discontinuous between the side portion A2 and the corner portion A3. In addition, the substrate may be physically discontinuous between adjacent stripe area SAs.

The patterned film 30 may be physically continuously positioned over the front portion A1 and the side portion A2 of the display panel 10. The patterned film 30 may be physically continuously positioned over the front portion A1 and the corner portion A3 of the display panel 10. However, the patterned film 30 may also be physically discontinuous between the side portion A2 and the corner portion A3 of the display panel 10, but may be continuous in some embodiments. In addition, the patterned film 30 may be physically discontinuous between adjacent stripe areas SA, but may be continuous in some embodiments.

The front portion A1 and the side portion A2 of the cover panel 40 may be physically continuous. However, the cover panel 40 may not be positioned in the corner portion A3 of the display device 100, but the coating layer 40c may be positioned in the corner portion A3 of the display device 100. The coating layer 40c may be physically continuously positioned between adjacent stripe areas SA. Adjacent edges of the coating layer 40c and the cover panel 40 may be pressed against each other, such that there is no gap therebetween.

Figure 5:
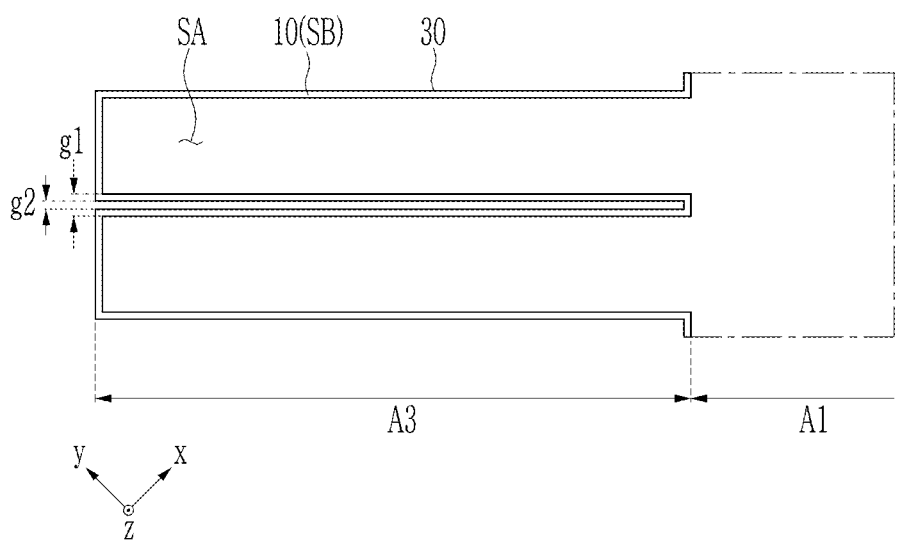
FIG. 5 is a schematic top plan view of a part of a corner and a front portion adjacent thereto in the display panel according to an embodiment.

FIG. 5 is a schematic top plan view of a part of a corner and a front portion adjacent thereto in the display panel according to an embodiment.

FIG. 5 illustrates two neighboring stripe areas SA among the stripe areas SA forming the corner portion A3 of the display panel 10. The stripe areas SA may protrude approximately radially from the front portion A1. The substrate SB of the display panel 10 may be formed substantially equivalent to the stripe area SA. The substrate SB may define the edge of the stripe area SA. Adjacent stripe area SAs may be spaced apart by a first gap g1.

The patterned film 30 that can be positioned on the rear surface of the display panel 10 may be formed to correspond to the stripe areas SA. In particular, the patterned film 30 may be cut like the stripe areas SA. The patterned film 30 may be formed with a width wider than the stripe area SA, and the patterned film 30 may protrude from both sides of the substrate SB. Portions of the patterned film 30 corresponding to the stripe area SA may be spaced apart by a second gap g2, which is narrower than the first gap g1. The second gap g2 may be zero. Accordingly, the coating layer 40c may be formed on the back surface of the patterned film 30 in the corner portion A3 without passing through a cutout portion of the patterned film 30. When the patterned film 30 has a sufficiently small modulus, the patterned film 30 may be stretched to conform to the curved surface of the corner portion A3, and thus, the patterned film 30 may be continuously formed without including the cutout portion in the corner portion A3.

Figure 6:
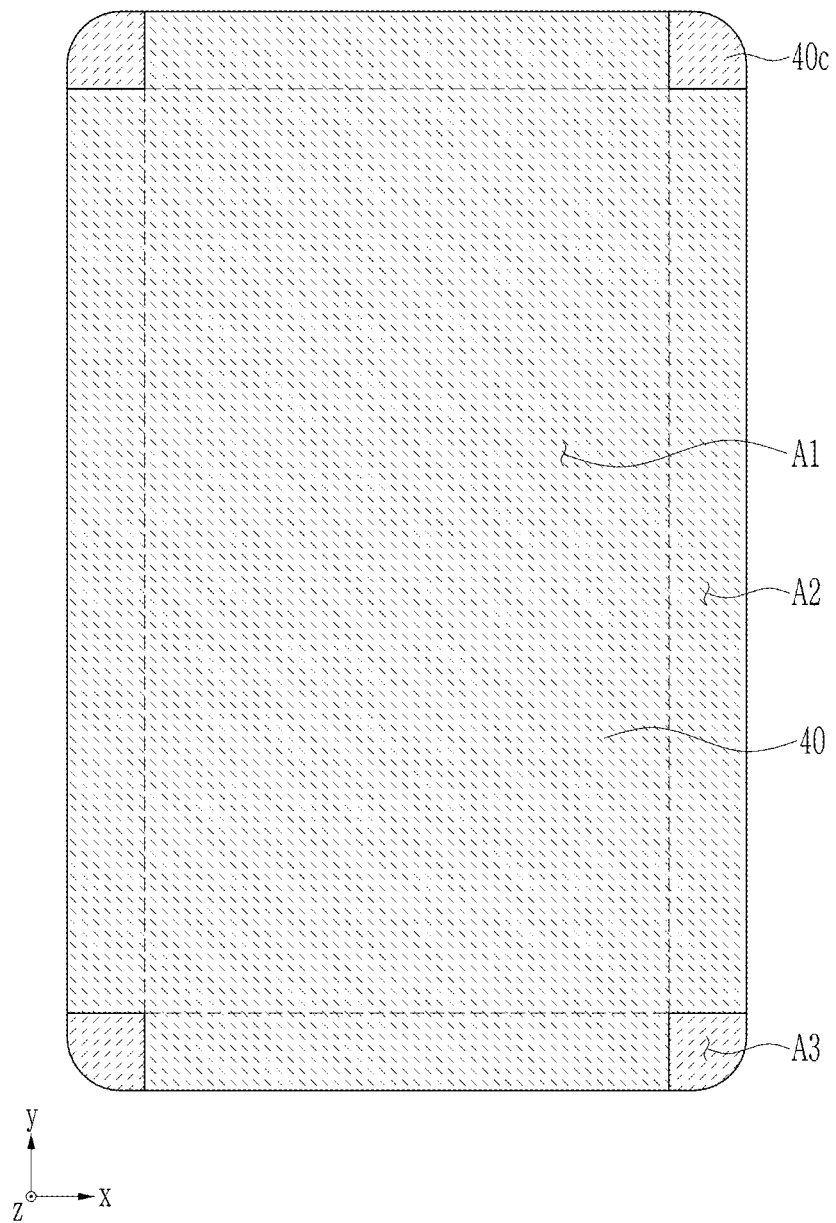
FIG. 6 is a top plan view of the cover panel separated from the display device according to an embodiment.

FIG. 6 is a top plan view of the cover panel separated from the display device according to an embodiment.

The cover panel 40 attached to the rear surface of the patterned film 30 may include a front portion A1 and side portions A2 respectively corresponding to the front portion A1 and the side portions A2 of the display device 100. However, the cover panel 40 may not include corner portions corresponding to the corner portions A3 of the display device 100. For example, the cover panel 40 may generally correspond to the display device 100 (or the display panel 10) as a whole, while having portions corresponding to corner portions A3 are cut out.

Since the corner portion A3 of the display device 100 has a double curved surface, when the flat cover panel 40 is attached to the double curved corner portion A3, wrinkles or creases may occur in the cover panel 40 and deteriorate the quality of the display device 100. According to an embodiment, since the cover panel 40 does not include portions corresponding to the corner portions A3 of the display device 100, wrinkles do not occur in the cover panel 40 at the corner portions A3 of the display device 100 when the cover panel 40 is attached. Instead, since the coating layer 40c that provides substantially equivalent functions as those of the cover panel 40 covers the rear surface of the corner portions A3 of the display panel 10, problems that may otherwise occur with a member of the cover panel 40 can be prevented or improved.

Figure 7:
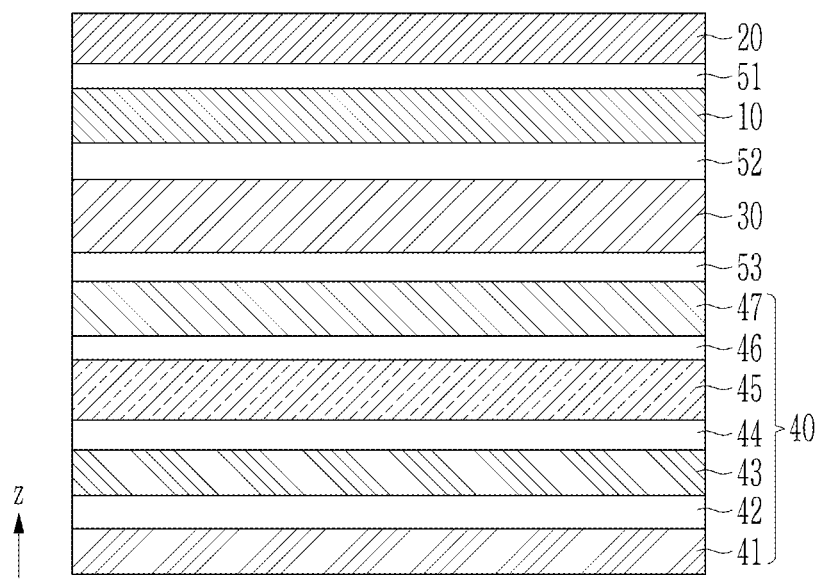
FIG. 7 is a schematic cross-sectional view of the front portion and the side portions of the display device according to an embodiment.
Figure 8:
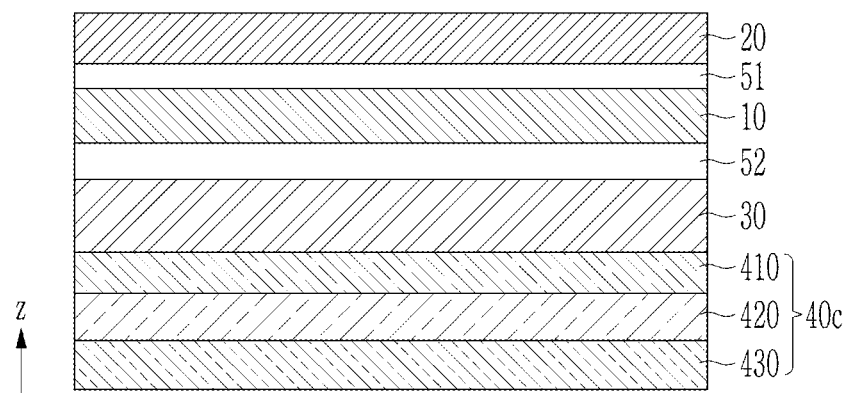
FIG. 8 is a schematic cross-sectional view of the corner portions of the display device according to an embodiment.

Referring to FIG. 7 and FIG. 8, a cross-sectional structure of the display device 100 will be described in more detail.

FIG. 7 is a schematic cross-sectional view of the front portion and the side portions of the display device according to an embodiment, and FIG. 8 is a schematic cross-sectional view of the corner portions of the display device according to an embodiment.

Referring to FIG. 7 and FIG. 8, the display device 100 may have a structure in which a window 20 is positioned on the display panel 10 in each of the front portion A1, the side portions A2, and the corner portions A3, and the patterned film 30 is positioned below the display panel 10. An adhesive layer 51, which may include an optically clear adhesive (OCA), may be disposed between the display panel 10 and the window 20 for attachment of the display panel 10 and the window 20. For attachment of the display panel 10 and the patterned film 30, an adhesive layer 52 including a pressure sensitive adhesive (PSA) may be provided between them.

In general, a polyethylene terephthalate (PET) film is used as the patterned film 30, but the PET film may not be suitable for attaching to the corner portion A3 of the display panel 10 due to its large modulus. When a silicon-based film with a small modulus, such as a PDMS film, is used as the patterned film 30, the patterned film 30 may be attached to the curved surface of the stripe area SA in the corner portion A3 of the display panel 10. The patterned film 30 may have a thickness of about 100 μm or more, for example about 400 μm, and thus, signal lines positioned on the display panel 10 may be positioned on the neutral plane. In order to secure adhesion to the silicon-based film, the adhesive layer 52 for attaching the patterned film 30 may include a silicon-based PSA.

The display device 100 may have a structure in which the cover panel 40 is positioned under the patterned film 30 in the front portion A1 and the side portion A2, and the coating layer 40c is positioned under the patterned film 30 in the corner portion A3. For the attachment of the cover panel 40 and the patterned film 30, an adhesive layer 53 including a PSA may be positioned between the cover panel 40 and the patterned film 30. However, the adhesive layer is not positioned between the coating layer 40c and the patterned film 30, and the coating layer 40c may be coated on the patterned film 30.

The cover panel 40 may have a structure in which a shield layer 41, an adhesive layer 42, a support layer 43, an adhesive layer 44, a cushion layer 45, an adhesive layer 46, and a light blocking layer 47 are stacked.

The shield layer 41 may prevent inflow of electromagnetic interference (EMI) and the like from the rear surface of the cover panel 40 toward the display panel 10. The shield layer 41 may be a metal layer containing metal with excellent thermal conductivity along with shield performance, such as copper or aluminum. The adhesive layer 42 may include a PSA, and the shield layer 41 and the support layer 43 may be attached thereto.

The support layer 43 may be provided to secure the strength of the cover panel 40 and to bond/separate the cushion layer 45 to/from other layers or members. The support layer 43 may be a plastic layer made of a polymer, such as polyimide (PI) or polyethylene terephthalate (PET). The adhesive layer 44 may include a PSA, and the support layer 43 and the cushion layer 45 may be attached thereto.

The cushion layer 45 may absorb the impact and prevent the display panel 10 from being damaged. For example, the cushion layer 45 may prevent damage to the display panel 10 from external impact, and may relieve impact and stress when the electronic device 1 is dropped. The cushion layer 45 may be a porous layer formed of a material such as polyurethane or polyethylene. The cushion layer 45 may include a foam resin. The adhesive layer 46 may include a PSA, and the cushion layer 45 and the light blocking layer 47 may be attached thereto.

The light blocking layer 47 may block light from entering the display panel 10 from the rear surface of the display panel 10, and may block the inside of the display device 100 from being viewed. The light blocking layer 47 may be a colored film, and may include a polymer (e.g., black PET) containing a black dye or pigment.

As described above, the cover panel 40 formed with the multi-layer structure includes the shield layer 41, which is particularly prone to baking deformation, and thus, the cover panel 40 may be vulnerable to wrinkles when attached to the corner portion A3 of the display device 100 or the display panel 10. Since the cover panel 40 according to an embodiment is formed to not include a portion that correspond to each corner portion A3 of the display device 100 or the display panel 10, wrinkles may be prevented from occurring in the corner portion A3 when the cover panel 40 is attached.

Meanwhile, although the structure of the cover panel 40 has been described as including the functional layers stacked in the order of the shield layer 41, the support layer 43, the cushion layer 45, and the light blocking layer 47, the inventive concepts are not limited thereto, and the stacking order of the functional layers may be changed. In addition, the cover panel 40 may further include a heat dissipation member that may include a carbon material, such as graphite, in addition to the above-described functional layers.

The coating layer 40c may include a primer layer 410, a foam coating layer 420, and a hard coating layer 430 sequentially disposed on the patterned film 30. The primer layer 410 may be placed directly on the patterned film 30. The foam coating layer 420 may be placed directly on the primer layer 410. The hard coating layer 430 may be positioned directly over the foam coating layer 420.

As the patterned film 30 contains a silicon-based polymer, such as PDMS, the surface energy of the patterned film 30 may be low and it may be difficult to secure adhesion. Therefore, when the coating layer is formed on the patterned film 30, the adhesion may be poor and the coating layer may be peeled off. In order to increase adhesion to the patterned film 30, the coating layer 40c may include the primer layer 410 as a layer in contact with the patterned film 30. The primer layer 410 may be a silicon primer layer 410 that has a good adhesion with a silicon-based film, and may be coated on the patterned film 30. The primer layer 410 may have a thickness of about 10 µm to about 50 µm.

In order to perform substantially equivalent functions (e.g., shield, light blocking, and impact resistance) as the cover panel 40, the coating layer 40c may include layers corresponding to the shield layer 41, the cushion layer 45, and the light blocking layer 47 of the cover panel 40.

The coating layer 40c may include a foam coating layer 420, which is a soft coating layer corresponding to the cushion layer 45. The foam coating layer 420 may be a porous layer formed of a polymer, such as polyurethane (PU), a water-dispersible polyurethane (WPU), or an epoxy resin. The foam coating layer 420 may include a foam resin. The foam coating layer 420 may be a black foam coating layer 420 containing a black dye or pigment, such that the foam coating layer 420 may provide a function of the light blocking layer 47. The foam coating layer 420 may have a thickness of about 100 µm to about 200 µm.

The hard coating layer 430 may be an EMI shield-type hard coating layer 430 including a conductive filler to perform a function of the shield layer 41. The hard coating layer 430 may include at least one of silver flakes, silver nanowire (AgNW), carbon nanotubes (CNT), and a copper powder, as a conductive filler for the EMI shield. The hard coating layer 430 may include organic and/or inorganic materials. For example, the hard coating layer 430 may be an organic-inorganic hybrid hard coating layer 430, in which an inorganic material such as silica nanoparticles is added to an organic material such as an acryl-based resin or an epoxy resin. The hard coating layer 430 may have a thickness of about 50 µm to about 100 µm.

Since the coating layer 40c is formed by coating, the coating layer 40c may conform to the curved surface of the corner portion A3 of the display device 100. The coating layer 40c may have a thickness of about 200 µm to about 300 µm. Although the coating layer 40c is exemplarily described as including three layers 410, 420, and 430, the inventive concepts are not limited thereto, and the coating layer 40c may further include a functional layer that may be formed by coating through an inkjet printing method or the like.

FIG. 9 to FIG. 14 schematically illustrate a manufacturing method of the display device according to an embodiment.

In the manufacturing method of the display device, a process for forming the coating layer 40c will be mainly described with reference to FIG. 9 to FIG. 14.

Figure 9:
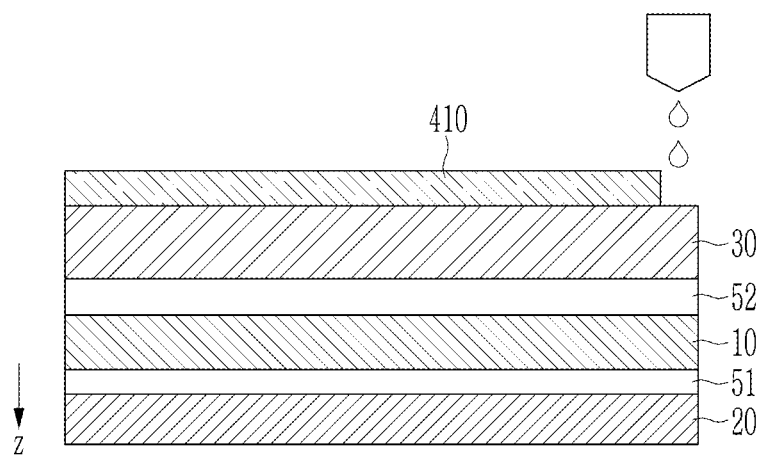
FIGS. 9, 10, 11, 12, 13, and 14 are views schematically illustrating a manufacturing method of the display device according to an embodiment.

Referring to FIG. 9, the patterned film 30 may be attached to the rear surface of the display panel 10 by the adhesive layer 52. Next, the display panel 10 to which the patterned film 30 is attached may be attached to the window 20 by the adhesive layer 51. Meanwhile, the cover panel 40 overlapping the front portion A1 and the side portions A2 of the display panel 10 (i.e., covering the front portion A1 and the side portions A2 of the display panel 10) may be attached to the rear surface of the patterned film 30 by using an adhesive layer 53 after attaching the display panel 10 to the window 20 (refer to FIG. 3 and FIG. 7). In order to form the coating layer 40c that overlaps the corner portion A3 of the display panel 10 (i.e., covering the corner portion A3 of the display panel 10) on the rear surface of the patterned film 30, the primer layer 410 may be formed by coating a silicone primer material on the surface of the patterned film 30. The silicone primer material may be light curable. In order to control fluidity of the primer layer 410, coating of the primer layer 410 may be performed by solvent-free coating or low-solvent coating.

Figure 10:
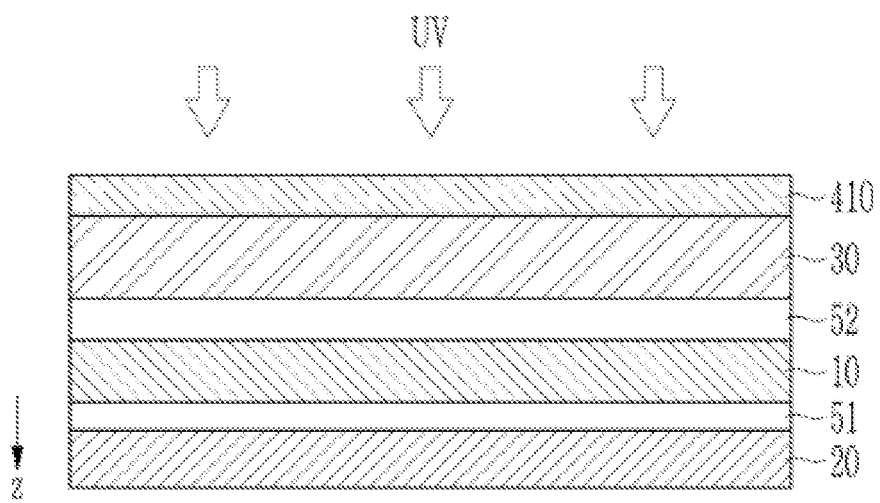

Referring to FIG. 10, by irradiating ultraviolet UV to the primer layer 410 coated on the patterned film 30, the primer layer 410 may be temporarily cured. The ultraviolet UV pre-curing energy may be about 100 mJ to about 300 mJ. Since the primer layer 410 is coated in the corner portion A3, the primer layer 410 can flow along the curved surface of the corner portion A3. As such, pre-curing the primer layer 410 after coating the primer layer 410 and before coating the foam coating layer 420, may prevent or minimize the flow of the primer layer 410. The pre-curing of the primer layer 410 may be performed, such that the primer layer 410 is cured at a curing rate of, for example, about 10% to about 80%, or about 30% to about 60%.

Figure 11:
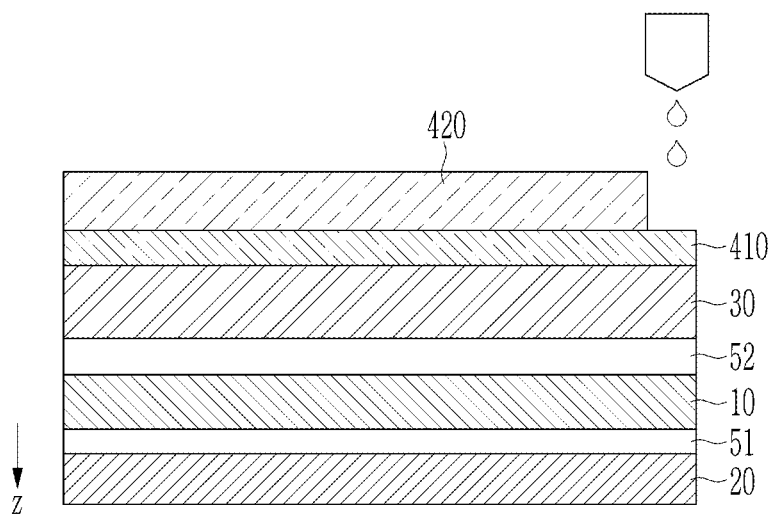

Referring to FIG. 11, the foam coating layer 420 may be formed by coating a foam forming material on a surface of the pre-cured primer layer 410. The foam forming material may be light curable. The foam forming material may include a black dye or pigment, and the foam coating layer 420 may be a black foam coating layer 420. After coating the foam, the solvent may be dried.

Figure 12:
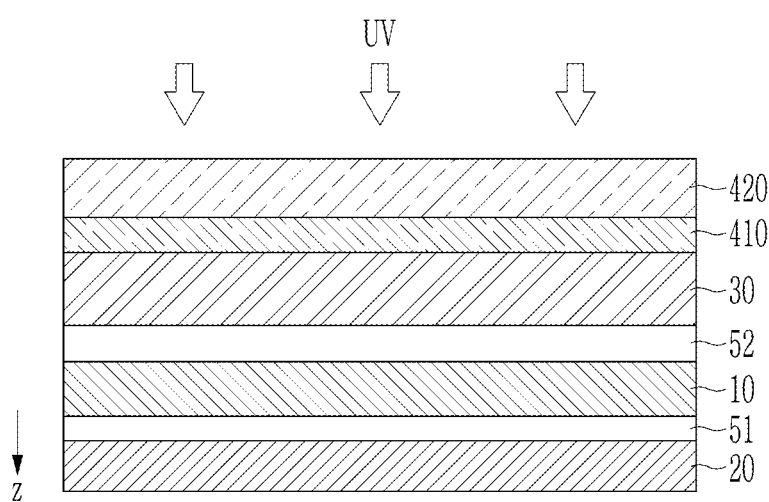

Referring to FIG. 12, the foam coating layer 420 may be pre-cured by irradiating ultraviolet UV to the foam coating layer 420 coated on the primer layer 410. The ultraviolet UV pre-curing energy may be about 100 mJ to about 300 mJ. As in the primer layer 410, the foam coating layer 420 is coated in a corner portion A3, and thus, the foam coating layer 420 may flow along a curved surface of the corner portion A3. As such, pre-curing the foam coating layer 420 after coating the foam coating layer 420 and before coating the hard coating layer 430 may prevent or minimize the flow of the foam coating layer 420. The pre-curing of the foam coating layer 420 may be performed, such that the foam coating layer 420 is cured at a curing rate of, for example, about 10% to about 80%, or about 30% to about 60%.

Figure 13:
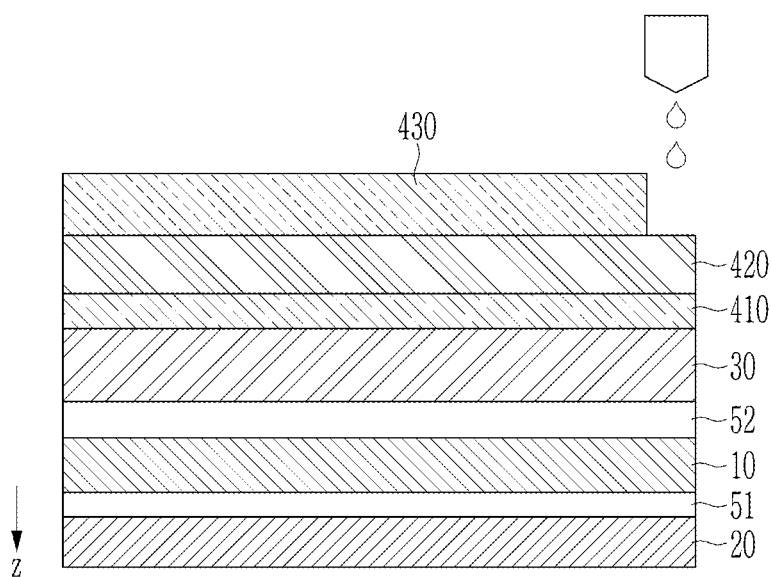

Referring to FIG. 13, the hard coating layer 430 may be formed by coating a hard coating material (e.g., an organic-inorganic hybrid hard coating material, in which inorganic materials such as silica nanoparticles are added to organic materials such as acryl-based resins or epoxy resins) on the surface of the pre-cured foam coating layer 420. The hard coating material may be light curable. The hard coating material may include a conductive filler, and the hard coating layer 430 may be an EMI shield type hard coating layer 430. After coating the hard coating material, the solvent may be dried.

Figure 14:
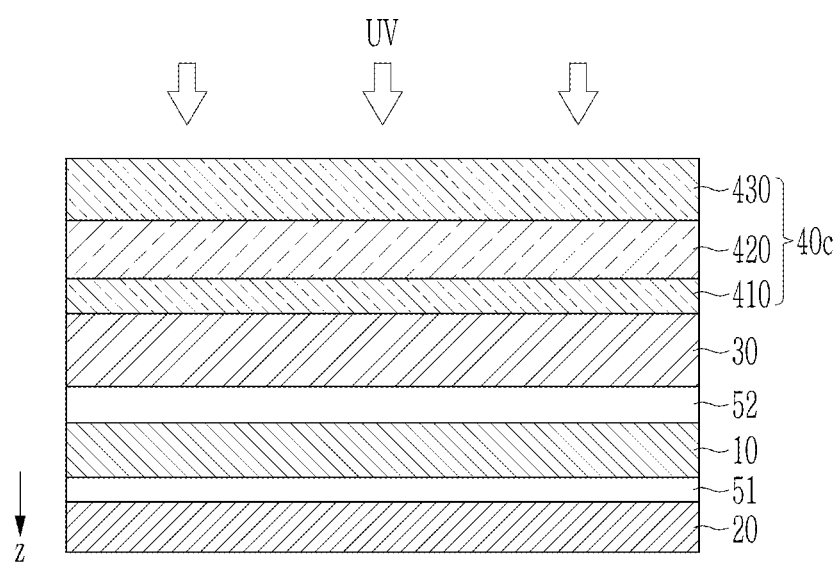
Figure 15:
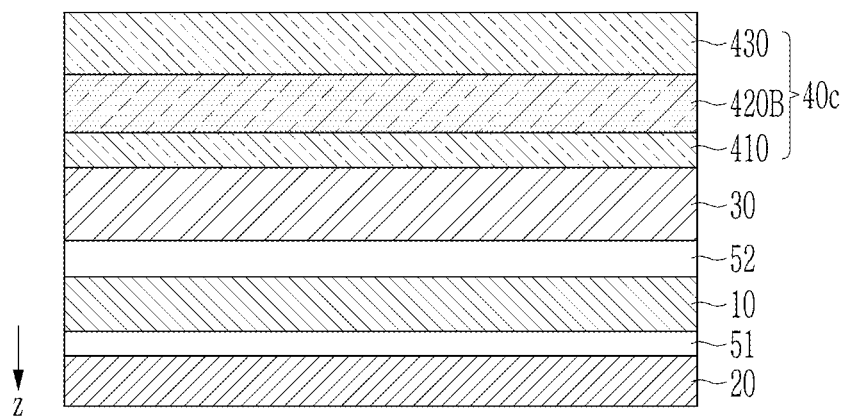
FIGS. 15, 16, 17, 18, 19, 20, and FIG. 21 are schematic cross-sectional views of the corner portion in the display device according to an embodiment.

Referring to FIG. 14, the primer layer 410, the foam coating layer 420, and the hard coating layer 430 may be cured by irradiating ultraviolet UV to the hard coating layer 430 coated on the foam coating layer 420. The ultraviolet UV main-curing energy may be about 800 mJ to about 3000 mJ. When the three coating layers 410, 420, and 430 are main-cured together, adhesion strength between these layers may be increased.

Meanwhile, coating of each layer 410, 420, and 430 can be carried out by an inkjet printing method, such that the coating layer 40*c* can be formed in the correct position.

FIG. 15 to FIG. 21 are schematic cross-sectional views of the corner portion in the display device according to an embodiment.

Figure 16:
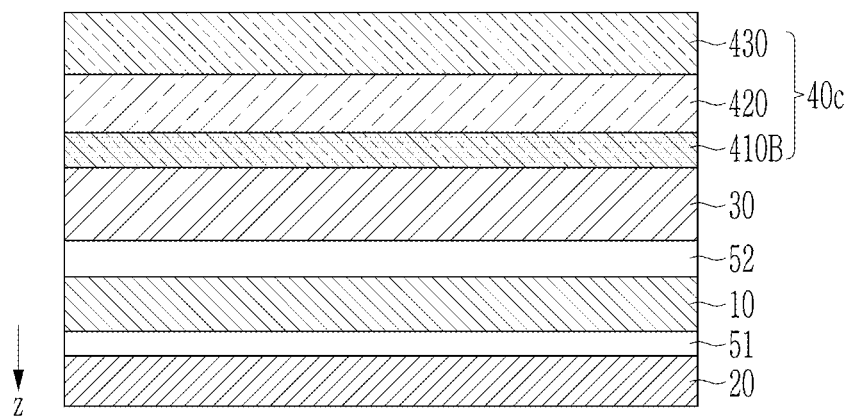
Figure 17:
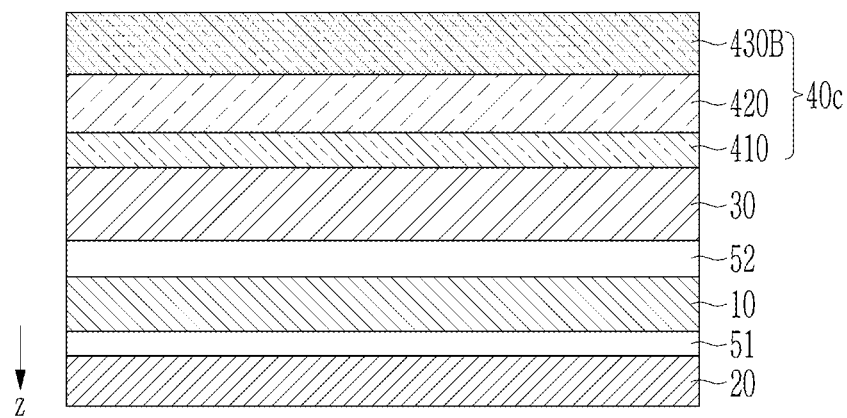
Figure 18:
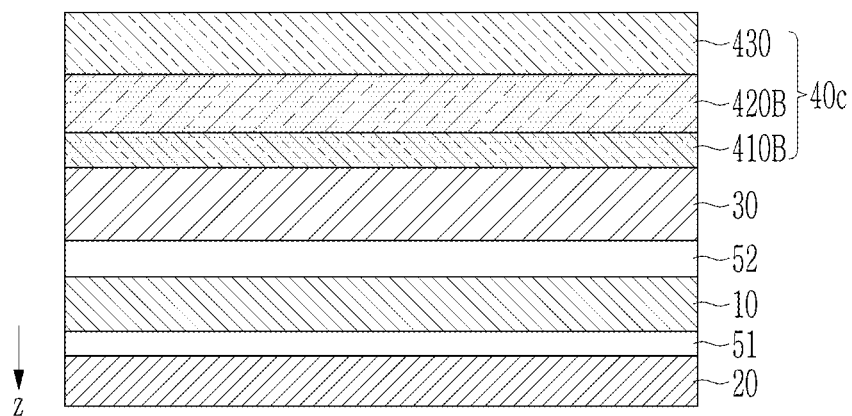

The coating layer 40*c* may include a layer containing a black dye or pigment as a configuration corresponding to the light blocking layer 47 of the cover panel 40. For example, referring to FIG. 15, the foam coating layer 420 may be a black foam coating layer 420B containing a black dye or pigment. Referring to FIG. 16, the primer layer 410 may be a black primer layer 410B containing a black dye or pigment. Referring to FIG. 17, the hard coating layer 430 may be a black hard coating layer 430B containing a black dye or pigment.

Figure 19:
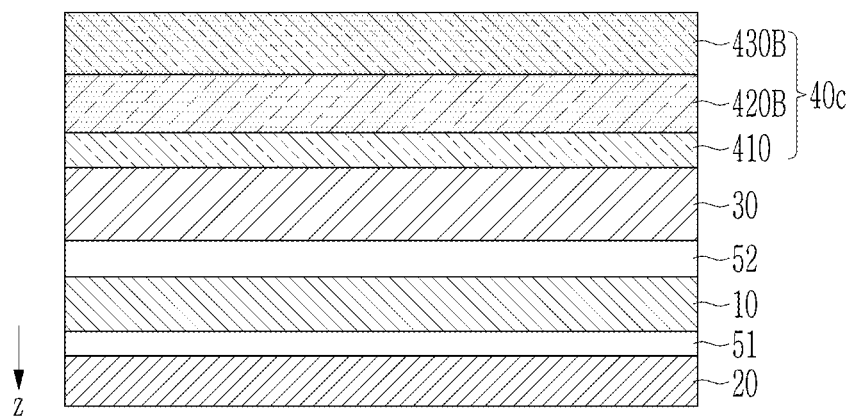
Figure 20:
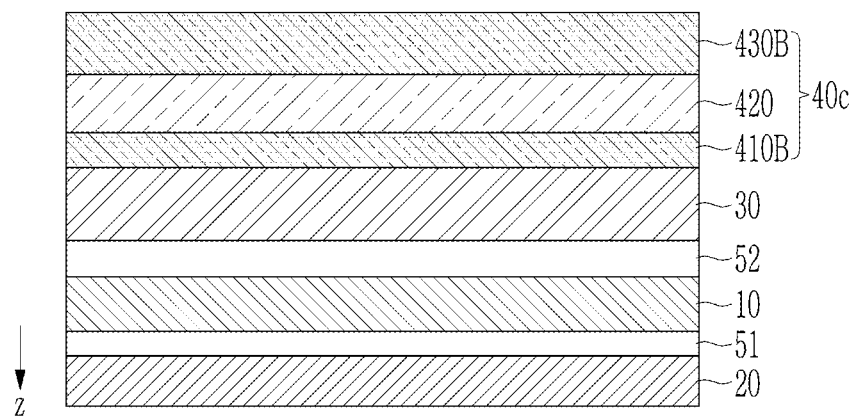
Figure 21:
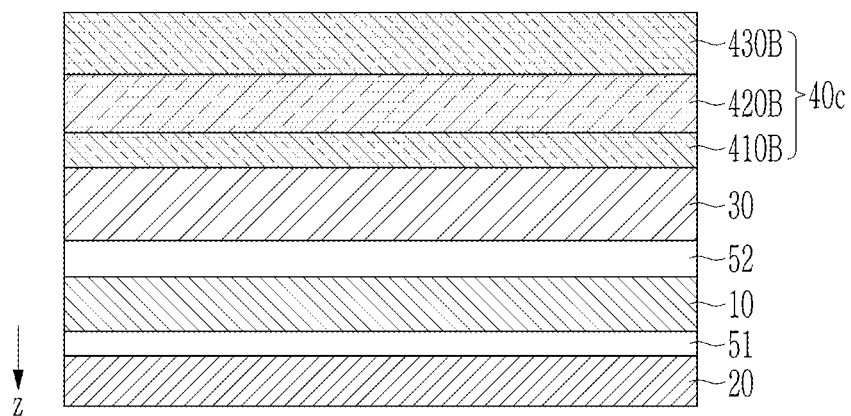

The black dye or pigment may be included in a plurality of layers. For example, referring to FIG. 18, the primer layer 410 and the foam coating layer 420 may be the black primer layer 410B and the black foam coating layer 420B, each containing a black dye or pigment. Referring to FIG. 19, the foam coating layer 420 and the hard coating layer 430 may respectively be the black foam coating layer 420B and the black hard coating layer 430B containing the black dye or pigment. Referring to FIG. 20, the primer layer 410 and the hard coating layer 430 may respectively be the black primer layer 410B and the black hard coating layer 430B containing the black dye or pigment. The black dye or pigment may be included in each of the layers of the coating layer 40*c*, as shown in FIG. 21. In particular, the primer layer 410, the foam coating layer 420, and the hard coating layer 430 may be the black primer layer 410B, the black foam coating layer 420B, and the black hard coating layer 430B, respectively. As such, at least one of the layers 410, 420, and 430 forming the coating layer 40*c* may function as a light blocking layer.

Figure 22:
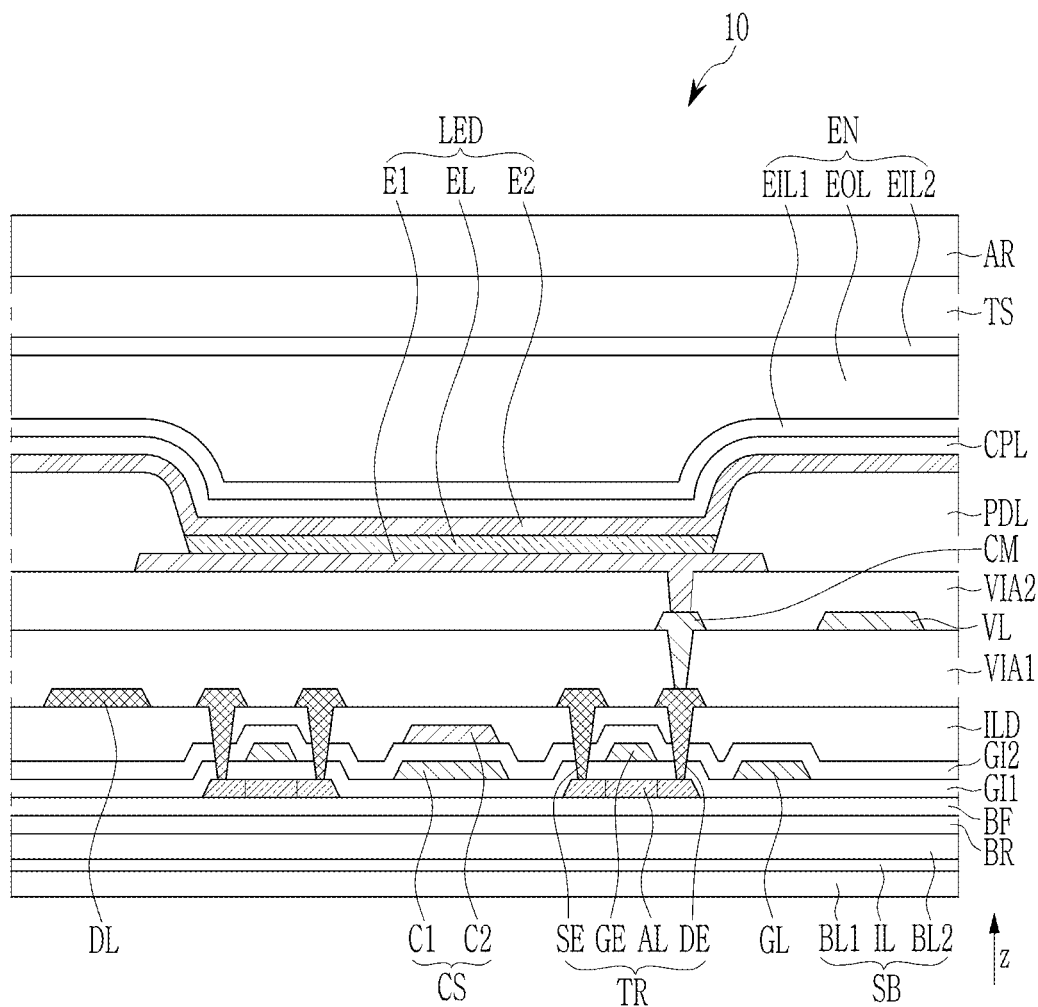
FIG. 22 is a cross-sectional view of a stacked structure of the display panel according to an embodiment.

FIG. 22 is a cross-sectional view of a stacked structure of the display panel according to an embodiment. The cross-section shown in FIG. 22 may correspond to approximately one pixel area.

Referring to FIG. 22, the display panel 10 includes a substrate SB, a transistor TR formed on the substrate SB, and a light emitting diode LED connected to the transistor TR. The light emitting diode LED may correspond to a pixel.

The substrate SB may be a flexible substrate SB capable of bending, folding, rolling, and the like. The substrate SB may be a multi-layer including a first base layer BL1, an inorganic layer IL, and a second base layer BL2. The first base layer BL1 and the second base layer BL2 may include a polymer resin, such as polyimide (PI), polyamide (PA), or polyethylene terephthalate (PET). The substrate SB may be cut and separated corresponding to each stripe area SA in the corner portion A3 of the display panel 10. Referring back to FIG. 7, the above-described patterned film 30 may be attached to a lower surface of the substrate SB, and an adhesive layer 52 for attaching the substrate SB and the patterned film 30 may be positioned between the substrate SB and the patterned film 30.

A barrier layer BR that prevents penetration of moisture, oxygen, and the like may be positioned on the substrate SB. The barrier layer BR may include an inorganic insulating material, such as a silicon nitride ($SiN_x$), a silicon oxide ($SiO_x$), a silicon oxynitride ($SiO_xN_y$), and the like, and may be single-layered or multi-layered.

A buffer layer BF may be positioned on the barrier layer BR. The buffer layer BF may improve characteristics of a semiconductor layer by blocking impurities from the substrate SB when the semiconductor layer is formed, and may relieve the stress of the semiconductor layer by flattening the surface of the substrate SB. The buffer layer BF may include an inorganic insulating material, such as a silicon nitride, a silicon oxide, or a silicon oxynitride, and may be a single layer or multiple layers. The buffer layer BF may include amorphous silicon (a-Si).

The semiconductor layer AL of the transistor TR may be positioned on the buffer layer BF. The semiconductor layer AL may include a first region, a second region, and a channel region between the first and second regions. The semiconductor layer AL may include any one of amorphous silicon, polysilicon, and an oxide semiconductor. For example, the semiconductor layer AL may include a low temperature polysilicon (LTPS), or an oxide semiconductor material including at least one of zinc (Zn), indium (In), gallium (Ga), and tin (Sn). For example, the semiconductor layer AL may include an indium-gallium-zinc oxide (IGZO).

A first gate insulating layer GI1 may be positioned on the semiconductor layer AL. The first gate insulating layer GI1 may include an inorganic insulating material, such as a silicon nitride, a silicon oxide, or a silicon oxynitride, and may be a single layer or multiple layers.

A first gate conductive layer may include a gate electrode GE of the transistor TR, a gate line GL, and a first electrode C1 of a storage capacitor CS. The first gate conductive layer may include molybdenum (Mo), aluminum (Al), copper (Cu), titanium (Ti), and the like, and may be a single layer or multiple layers.

A second gate insulating layer GI2 may be positioned on the first gate conductive layer. The second gate insulating layer GI2 may include an inorganic insulating material, such as a silicon nitride, a silicon oxide, or a silicon oxynitride, and may be a single layer or multiple layers.

A second gate conductive layer that may include a second electrode C2 of the storage capacitor CS may be positioned on the second gate insulating layer GI2. The second gate conductive layer may include molybdenum (Mo), aluminum (Al), copper (Cu), titanium (Ti), and the like, and may be a single layer or multiple layers.

An interlayer insulating layer ILD may be positioned on the second gate insulating layer GI2 and the second gate conductive layer. The interlayer insulating layer ILD may include an inorganic insulating material, such as a silicon nitride, a silicon oxide, or a silicon oxynitride, and may be a single layer or multiple layers.

A first data conductive layer that may include a first electrode SE and a second electrode DE of the transistor TR, a data line DL, and the like may be positioned on the interlayer insulating layer ILD. The first electrode SE and the second electrode DE may be respectively connected to a first region and a second region of the semiconductor layer AL through contact holes formed in the insulating layers GI1, GI2, and ILD. One of the first electrode SE and second electrode DE may be a source electrode and the other may be a drain electrode. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers.

A first planarization layer VIA1 may be positioned on the first data conductive layer. The first planarization layer VIA1 may include an organic insulating material, such as a general-purpose polymer, which may include polymethyl methacrylate (PMMA) or polystyrene (PS), polymer derivatives with phenolic groups, acryl-based polymers, imide-based polymers (e.g., polyimides), siloxane-based polymers, and the like.

A second data conductive layer that may include a voltage line VL, a connecting member CM, and the like may be positioned on the first planarization layer VIA1. The voltage line VL may transmit a driving voltage, a common voltage, an initialization voltage, a reference voltage, and the like. The connecting member CM may be connected to the second electrode DE of the transistor TR through a contact hole formed in the first planarization layer VIA1. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers.

A second planarization layer VIA2 may be positioned on the second data conductive layer. The second planarization layer VIA2 may include an organic insulating material, such as a general-purpose polymer, which may include polymethyl methacrylate (PMMA) or polystyrene (PS), polymer derivatives with phenolic groups, acryl-based polymers, imide-based polymers, siloxane-based polymers, and the like.

The first electrode E1 of the light emitting diode LED may be positioned on the second planarization layer VIA2. The first electrode E1 may also be referred to as a pixel electrode. The first electrode E1 may be connected with the connecting member CM through a contact hole of the second planarization layer VIA2. Thus, the first electrode E1 is electrically connected with the second electrode DE of the transistor TR, and thus, receives a driving current that controls luminance of the light emitting diode LED. The transistor TR to which the first electrode E1 is connected may be a driving transistor or a transistor electrically connected to the driving transistor. The first electrode E1 may be formed of a reflective conducting material or a semi-transparent conducting material, or may be formed of a transparent conductive material. The first electrode E1 may include a transparent conductive material, such as an indium tin oxide (ITO) or an indium zinc oxide (IZO). The first electrode E1 may include metal or metal alloy, such as lithium (Li), calcium (Ca), aluminum (Al), silver (Ag), magnesium (Mg), or gold (Au).

A pixel defining layer PDL may be positioned on the second planarization layer VIA2 and the first electrode E1. The pixel defining layer PDL may be referred to as a bank or barrier rib, and may have an opening overlapping the first electrode E1. The pixel defining layer PDL may include an organic insulating material, such as a general-purpose polymer, which may include polymethyl methacrylate (PMMA) or polystyrene (PS), polymer derivatives with phenolic groups, acryl-based polymers, imide-based polymers, siloxane-based polymers, and the like.

An emission layer EL of the light emitting diode LED may be positioned on the first electrode E1. At least one of a hole injection layer (HIL), a hole transport layer (HTL), an electron transport layer (ETL), and an electron injection layer (EIL) may be positioned in addition to the emission layer EL on the first electrode E1.

A second electrode E2 of the light emitting diode LED may be positioned on the emission layer EL. The second electrode E2 may be referred to as a common electrode. The second electrode E2 is formed as a thin layer using metal or metal alloy with a low work function, such as calcium (Ca), barium (Ba), magnesium (Mg), aluminum (Al), or silver (Ag), thereby having light transmittance. The second electrode E2 may include a transparent conductive oxide, such as an indium tin oxide (ITO) or an indium zinc oxide (IZO).

The first electrode E1, the emission layer EL, and the second electrode E2 of each pixel may form a light emitting diode LED, such as an organic light emitting diode (OLED). The first electrode E1 may be an anode, and the second electrode E2 may be a cathode, for example.

A capping layer CPL may be positioned on the second electrode E2. The capping layer CPL may improve optical efficiency by adjusting a refractive index. The capping layer CPL may be positioned to completely cover the second electrode E2. The capping layer CPL may include an organic insulating material or an inorganic insulating material.

An encapsulation layer EN may be positioned on the capping layer CPL. The encapsulation layer EN may prevent penetration of moisture or oxygen from the outside by encapsulating the light emitting diode LED. The encapsulation layer EN may be a thin film encapsulation layer, in which an organic layer EOL is positioned between a first inorganic layer EIL1 and a second inorganic layer EIL2.

A touch sensor layer TS including touch electrodes may be positioned on the encapsulation layer EN. An anti-reflection layer AR for reducing reflection of external light may be positioned on the touch sensor layer TS.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel including a front portion and a corner portion disposed at a corner of the front portion;
   a patterned film disposed on a rear surface of the display panel;
   a cover panel disposed on a rear surface of the patterned film and overlapping the front portion;
   a coating layer disposed on the rear surface of the patterned film and overlapping the corner portion; and
   an adhesive layer disposed between the cover panel and the rear surface of the patterned film,
   wherein the coating layer is directly disposed on the rear surface of the patterned film.

2. The display device of claim 1, wherein the coating layer comprises a primer layer disposed on the patterned film, a foam coating layer disposed on the primer layer, and a hard coating layer disposed on the foam coating layer.

3. The display device of claim 2, wherein:
   the patterned film comprises a silicon-based polymer; and
   the primer layer comprises a silicon primer layer.

4. The display device of claim 2, wherein the hard coating layer comprises a conductive filler.

5. The display device of claim 2, wherein at least one of the primer layer, the foam coating layer, and the hard coating layer includes a black dye or pigment.

6. The display device of claim 1, wherein the coating layer is thinner than the cover panel.

7. The display device of claim 1, wherein the cover panel comprises at least one of a shield layer, a support layer, a cushion layer, and a light blocking layer.

8. The display device of claim 1, wherein:
   the front portion is flat, and the corner portion has a double curved surface;

the corner portion comprises a plurality of stripe areas separated from each other; and the plurality of stripe areas are combined to form the double curved surface of the corner portion.

9. The display device of claim 8, wherein:

the patterned film comprises a plurality of portions corresponding to the plurality of stripe areas; and a first gap between adjacent stripe areas is greater than a second gap between adjacent portions of the patterned film.

10. An electronic device comprising:

a display panel including a front portion, a side portion disposed at a side of the front portion, and a corner portion disposed at a corner of the front portion;

a patterned film attached to the display panel;

a cover panel attached to the patterned film and covering the front portion and the side portion;

a coating layer coated on the patterned film and covering the corner portion; and an adhesive layer disposed between the cover panel and the rear surface of the patterned film, wherein the coating layer is directly disposed on the rear surface of the patterned film.

11. The electronic device of claim 10, wherein:

the display panel comprises a substrate, a transistor disposed on the substrate, and a light emitting diode connected to the transistor; and the patterned film is attached to the substrate.

12. The electronic device of claim 10, wherein:

the corner portion includes a double curved surface; and the coating layer comprises a primer layer coated on a surface of the patterned film, a foam coating layer coated on a surface of the primer layer, and a hard coating layer coated on a surface of the foam coating layer.

13. The electronic device of claim 12, wherein:

the patterned film comprises a silicon-based polymer; and the primer layer comprises a silicon primer layer.

14. The electronic device of claim 12, wherein the hard coating layer comprises a conductive filler.

15. The electronic device of claim 12, wherein at least one of the primer layer, the foam coating layer, and the hard coating layer includes a black dye or pigment.

16. The electronic device of claim 10, wherein:

the corner portion comprises a plurality of stripe areas separated from each other;

the patterned film comprises a plurality of portions corresponding to the plurality of stripe areas; and a gap between adjacent portions of the patterned film is less than a gap between adjacent stripe areas.

17. A manufacturing method of a display device, comprising:

attaching a patterned film to a display panel that includes a front portion and a corner portion disposed at a corner of the front portion;

attaching the display panel to which the patterned film is attached to a window;

attaching a cover panel to the patterned film to overlap the front portion while not overlapping the corner portion; and forming a coating layer on a surface of the patterned film to overlap the corner portion.

18. The manufacturing method of the display device of claim 17, wherein forming the coating layer comprises:

forming a primer layer on the surface of the patterned film;

forming a foam coating layer on a surface of the primer layer; and forming a hard coating layer on a surface of the foam coating layer.

19. The manufacturing method of the display device of claim 18, wherein the primer layer is pre-cured before forming the foam coating layer, the foam coating layer is pre-cured before forming the hard coating layer, and the primer layer and the foam coating layer are main-cured after forming the hard coating layer.

* * * * *